(12) United States Patent
Lee et al.

(10) Patent No.: US 8,936,969 B2
(45) Date of Patent: Jan. 20, 2015

(54) SEMICONDUCTOR DEVICE AND METHOD OF SINGULATING SEMICONDUCTOR WAFER ALONG MODIFIED REGION WITHIN NON-ACTIVE REGION FORMED BY IRRADIATING ENERGY THROUGH MOUNTING TAPE

(75) Inventors: Hunteak Lee, Gyeonggi-do (KR);
Daewook Yang, Gyeonggi-do (KR);
Yeongbeom Ko, Gyeonggi-do (KR)

(73) Assignee: STATS ChipPAC, Ltd., Singapore (SG)

( * ) Notice: Subject to any disclaimer, the term of this patent is extended or adjusted under 35 U.S.C. 154(b) by 97 days.

(21) Appl. No.: 13/426,416

(22) Filed: Mar. 21, 2012

(65) Prior Publication Data

US 2013/0249079 A1    Sep. 26, 2013

(51) Int. Cl.
*H01L 21/00* (2006.01)
*H01L 21/30* (2006.01)
*H01L 21/46* (2006.01)

(52) U.S. Cl.
USPC ........... 438/113; 438/110; 438/118; 438/458; 438/463; 438/464; 438/473; 257/E21.584

(58) Field of Classification Search
CPC ........... H01L 2224/32225; H01L 2924/15311; H01L 2924/00; H01L 2224/73265
USPC ......... 438/110, 118, 113, 458, 463, 464, 473, 438/613; 257/E21.584
See application file for complete search history.

(56) References Cited

U.S. PATENT DOCUMENTS

| | | | |
|---|---|---|---|
| 7,563,642 B2 | 7/2009 | Higashino | |
| 7,807,507 B2 | 10/2010 | Kim et al. | |
| 8,043,698 B2 * | 10/2011 | Morishima et al. | ........... 428/343 |
| 2007/0155131 A1 | 7/2007 | Contes | |
| 2008/0293218 A1 | 11/2008 | Nakamura | |
| 2010/0120229 A1 | 5/2010 | Nakamura et al. | |
| 2010/0203678 A1 * | 8/2010 | Fukumitsu et al. | ........... 438/113 |
| 2010/0267199 A1 | 10/2010 | Hatakeyama et al. | |
| 2011/0034007 A1 | 2/2011 | Yodo et al. | |
| 2011/0318879 A1 * | 12/2011 | Hatakeyama et al. | ........ 438/114 |
| 2012/0181686 A1 * | 7/2012 | Park et al. | ..................... 257/737 |

* cited by examiner

*Primary Examiner* — Michelle Mandala
(74) *Attorney, Agent, or Firm* — Robert D. Atkins; Patent Law Group: Atkins and Associates, P.C.

(57) ABSTRACT

A semiconductor device has a semiconductor wafer with a plurality of semiconductor die separated by a non-active region. The semiconductor die can be circular or polygonal with three or more sides. A plurality of bumps is formed over the semiconductor die. A portion of semiconductor wafer is removed to thin the semiconductor wafer. A wafer ring is mounted to mounting tape. The semiconductor wafer is mounted to the mounting tape within the wafer ring. The mounting tape includes translucent or transparent material. A penetrable layer is applied over the bumps formed over the semiconductor wafer. An irradiated energy from a laser is applied through the mounting tape to the non-active region to form a modified region within the non-active region. The semiconductor wafer is singulated along the modified region to separate the semiconductor die.

24 Claims, 14 Drawing Sheets

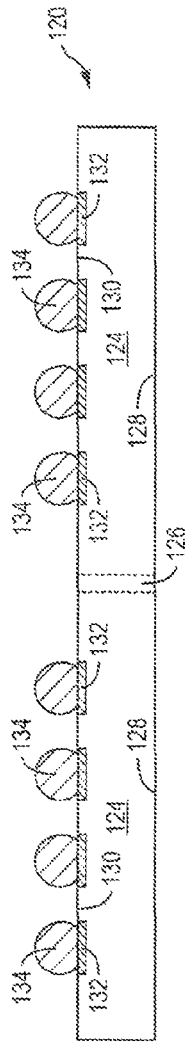
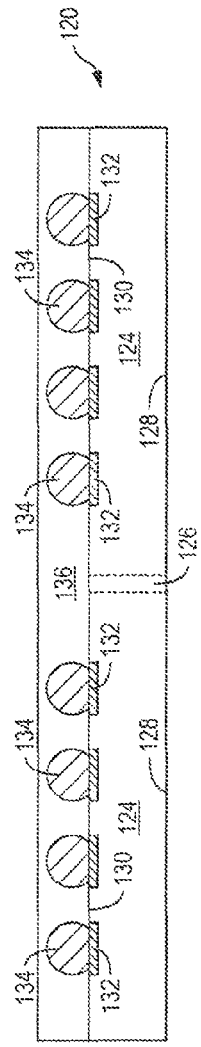
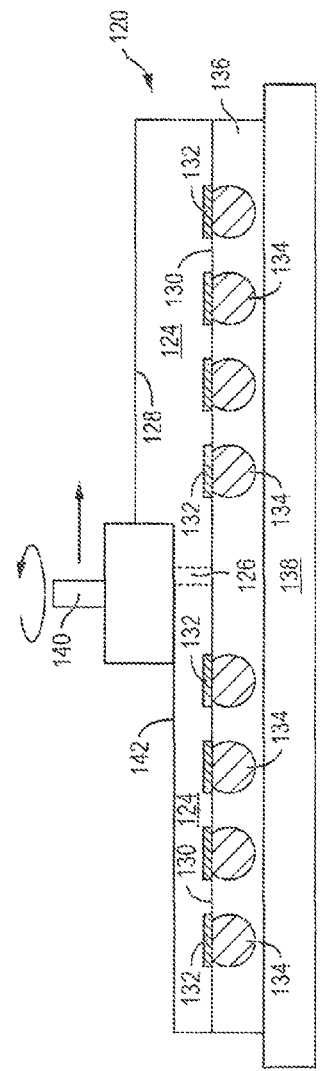
FIG. 3e
FIG. 3f
FIG. 3g

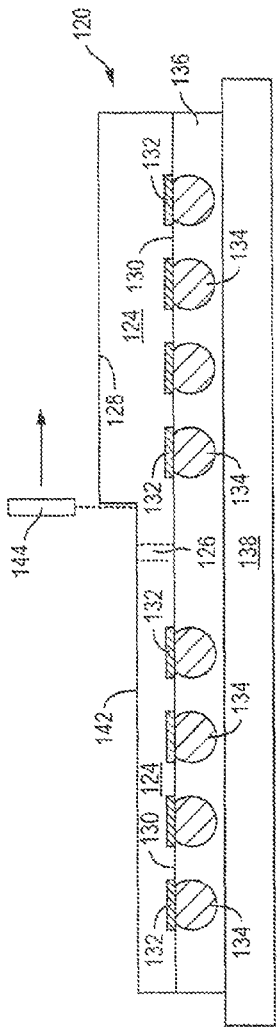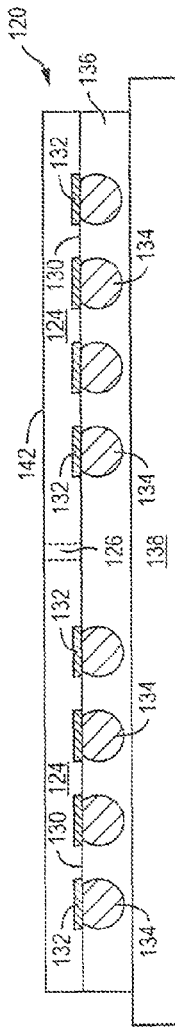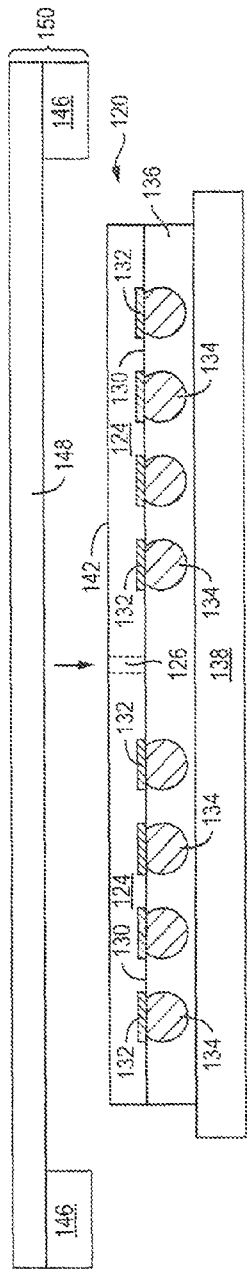

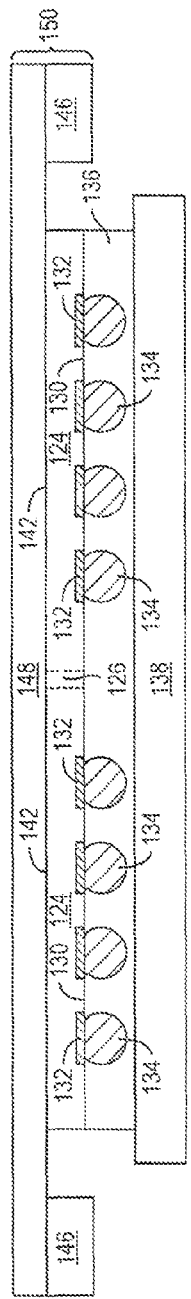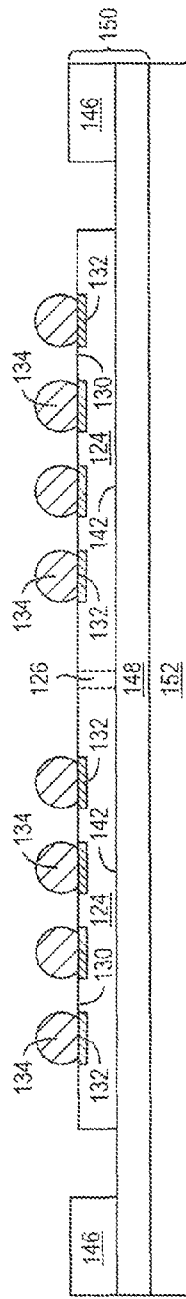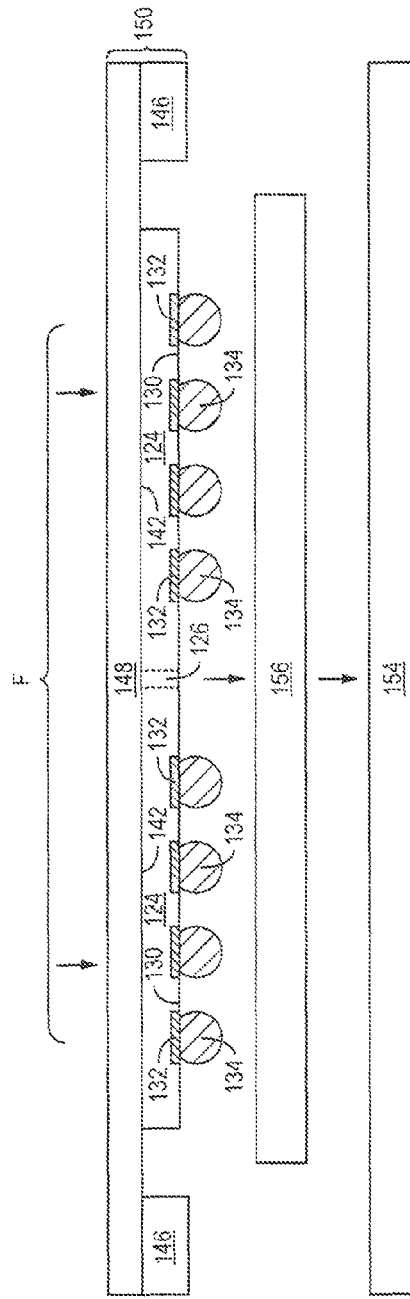

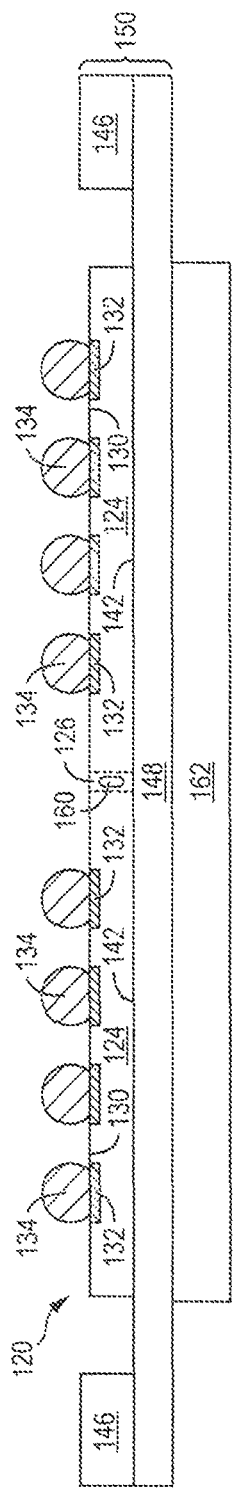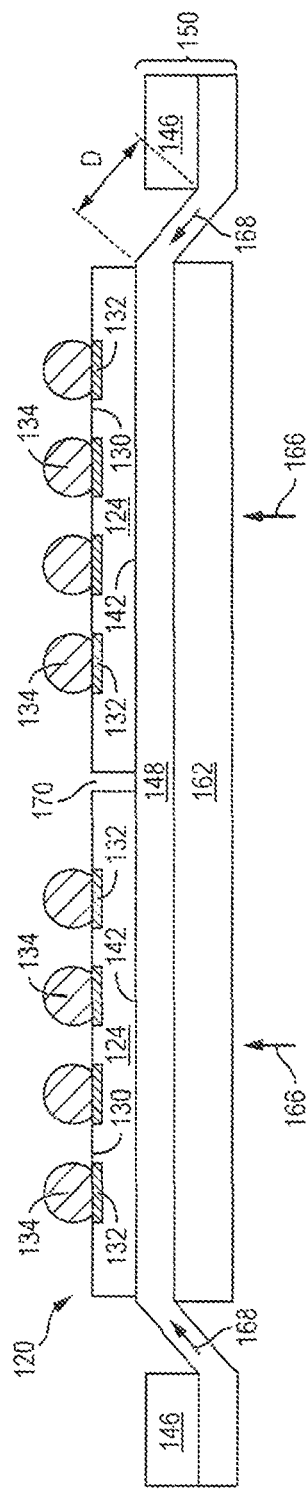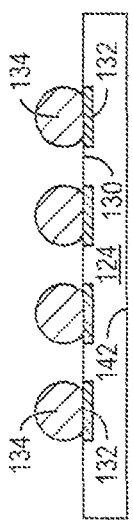

SEMICONDUCTOR DEVICE AND METHOD OF SINGULATING SEMICONDUCTOR WAFER ALONG MODIFIED REGION WITHIN NON-ACTIVE REGION FORMED BY IRRADIATING ENERGY THROUGH MOUNTING TAPE

FIELD OF THE INVENTION

The present invention relates in general to semiconductor devices and, more particularly, to a semiconductor device and method of singulating a semiconductor wafer along a modified region within a non-active region by irradiating energy through a mounting tape.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A semiconductor wafer contains a plurality of semiconductor die separated by a saw street. The semiconductor wafer can be mounted to backgrinding tape to support the wafer during a backgrinding process to reduce wafer thickness. The semiconductor wafer is singulated by a saw blade or laser cutting tool into individual semiconductor die. The singulation process introduces contaminate material or debris over the semiconductor wafer. The contaminate material must be removed by a wafer cleaning process to avoid defects. The semiconductor die are subject to die shifting during mounting and removal of the backgrinding tape. In addition, the semiconductor wafer should be handled as little as possible to reduce the chance of breakage or other damage to the wafer.

SUMMARY OF THE INVENTION

A need exists for a more efficient singulation of a semiconductor wafer while producing less contaminating material. Accordingly, in one embodiment, the present invention is a method of making a semiconductor device comprising the steps of providing a semiconductor wafer having a plurality of semiconductor die separated by a non-active region, forming a plurality of bumps over the semiconductor die, providing a mounting tape, mounting the semiconductor wafer to the mounting tape, applying a penetrable layer over the bumps formed over the semiconductor wafer, applying irradiated energy to the non-active region through the mounting tape to form a modified region within the non-active region, and singulating the semiconductor wafer along the modified region to separate the semiconductor die.

In another embodiment, the present invention is a method of making a semiconductor device comprising the steps of providing a semiconductor wafer, providing a mounting tape, mounting the semiconductor wafer to the mounting tape, providing a laser, applying irradiated energy from the laser through the mounting tape to form the modified region within the non-active region, and singulating the semiconductor wafer along the modified region.

In another embodiment, the present invention is a method of making a semiconductor device comprising the steps of providing a semiconductor wafer, providing a mounting tape, mounting the semiconductor wafer to the mounting tape, applying energy to a non-active region of the semiconductor wafer through the mounting tape to form a modified region within the non-active region, and singulating the semiconductor wafer along the modified region.

In another embodiment, the present invention is a semiconductor device comprising a semiconductor wafer and mounting tape with the semiconductor wafer mounted to the mounting tape. A modified region is formed within a non-active region of the semiconductor wafer by applying energy through the mounting tape to the non-active region.

BRIEF DESCRIPTION OF THE DRAWINGS

FIG. 4 illustrates a semiconductor die singulated from a semiconductor wafer by stealth dicing through a mounting tape.

DETAILED DESCRIPTION OF THE DRAWINGS

Figure 1:
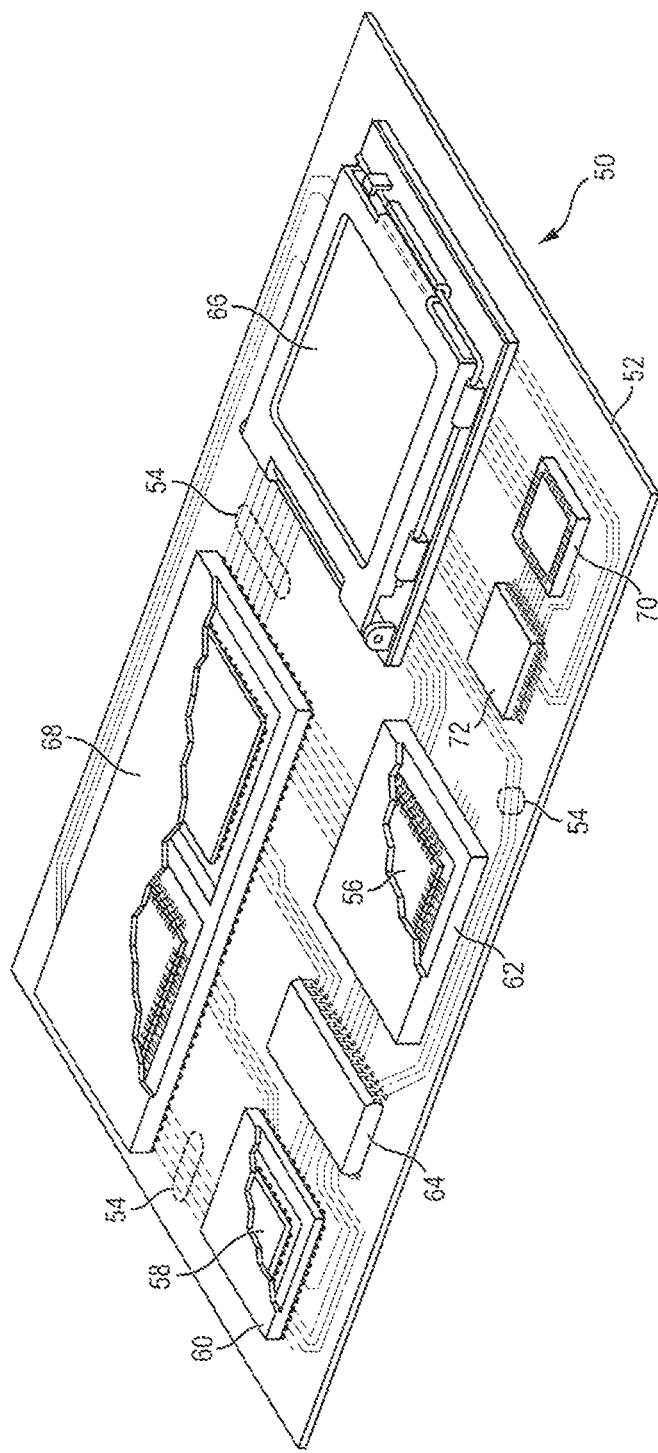
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), self-assembly, electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken or otherwise separated along non-functional regions of the wafer called non-active regions or scribes. The wafer is singulated using a scribe, laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
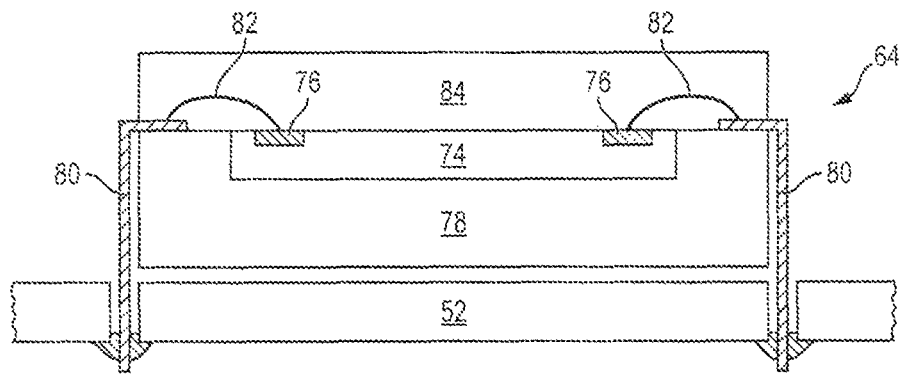
FIGS. 2a-2c illustrate further detail of the representative semiconductor packages mounted to the PCB.
Figure 2B:
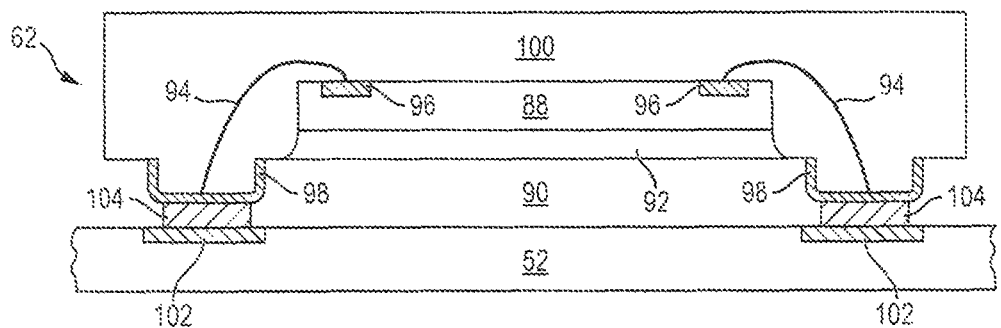
Figure 2C:
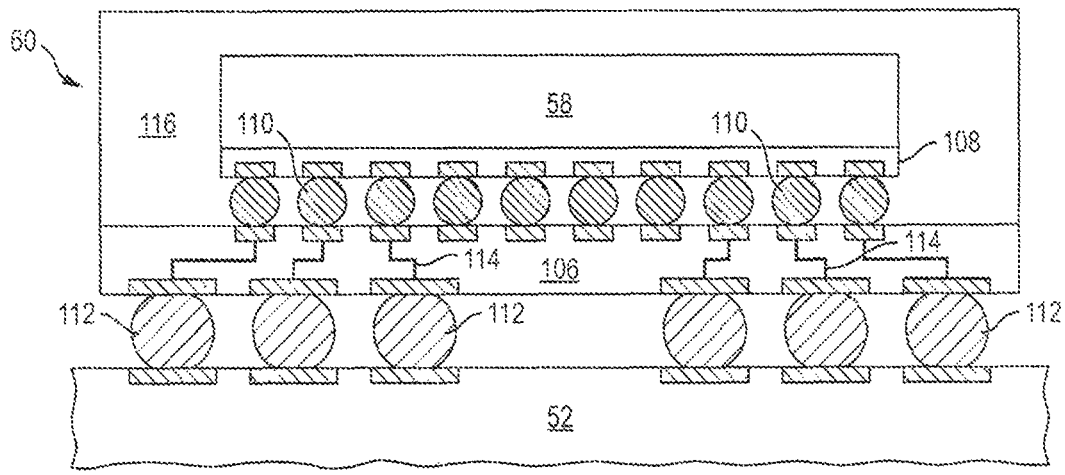

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
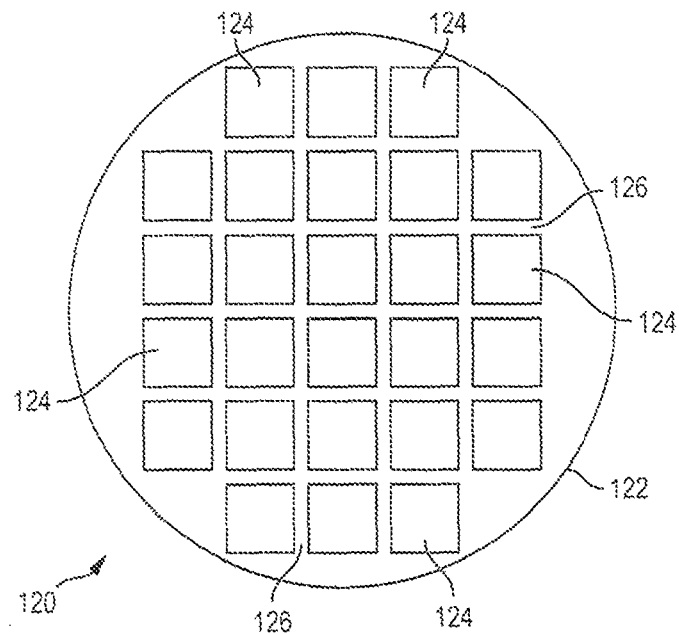
FIGS. 3a-3x illustrate a process of singulating a semiconductor wafer by stealth dicing through a mounting tape.
Figure 3B:
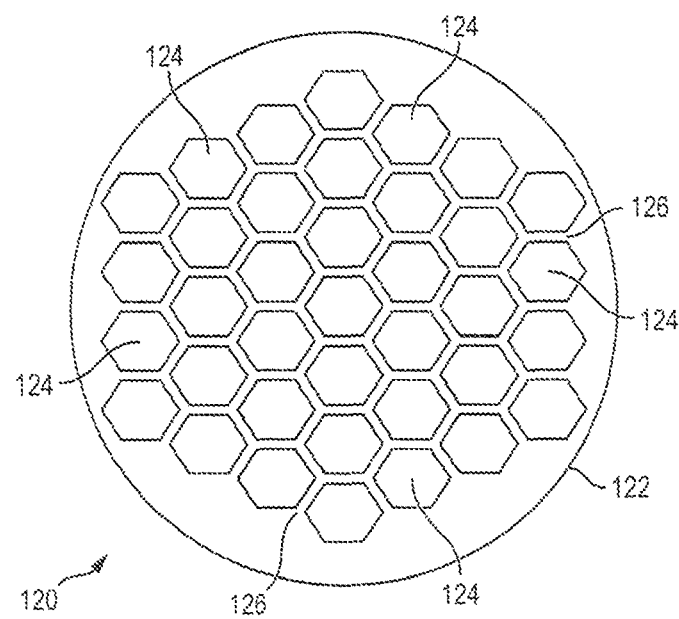
Figure 3C:
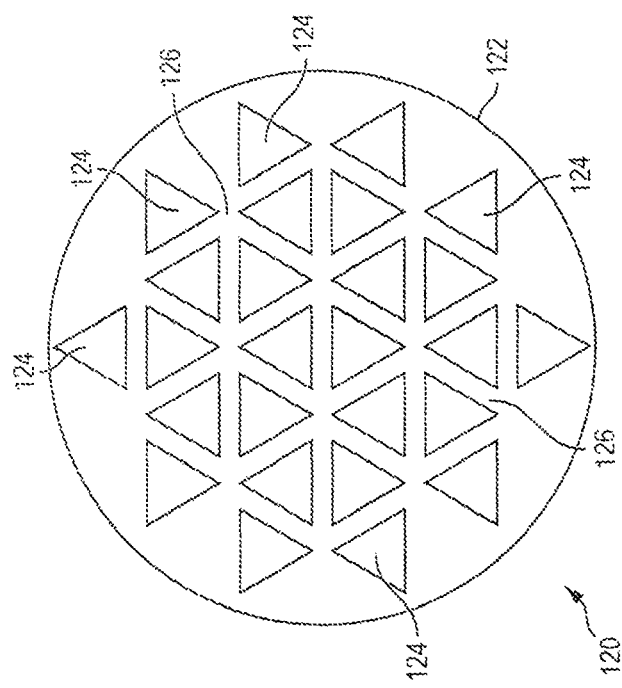
Figure 3D:
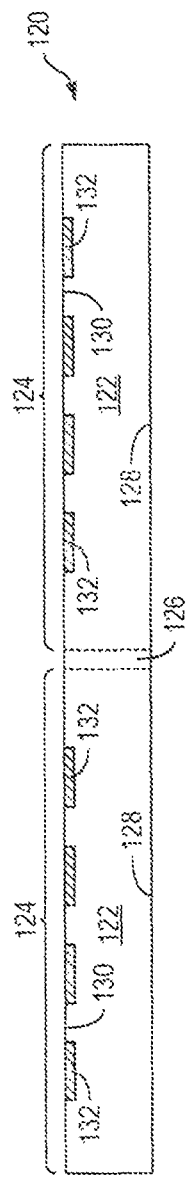
Figure 3N:
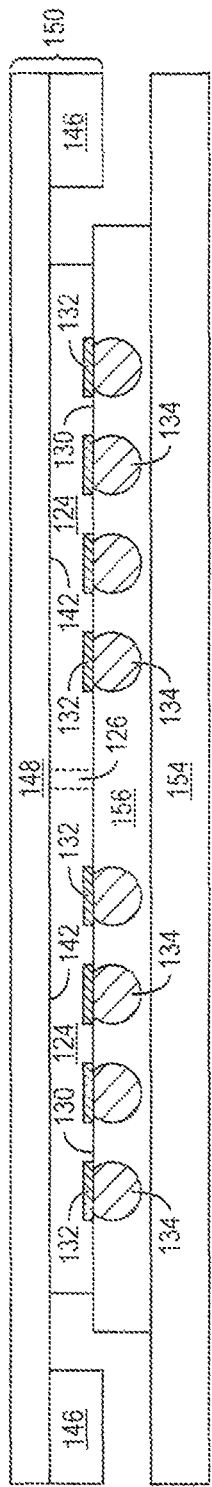
Figure 3O:
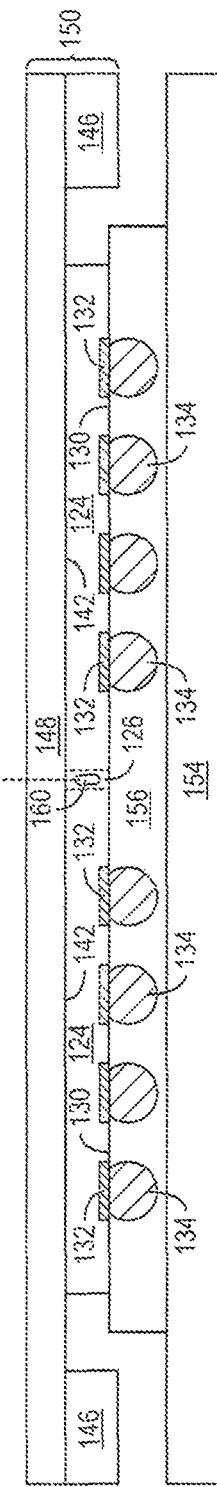
Figure 3P:
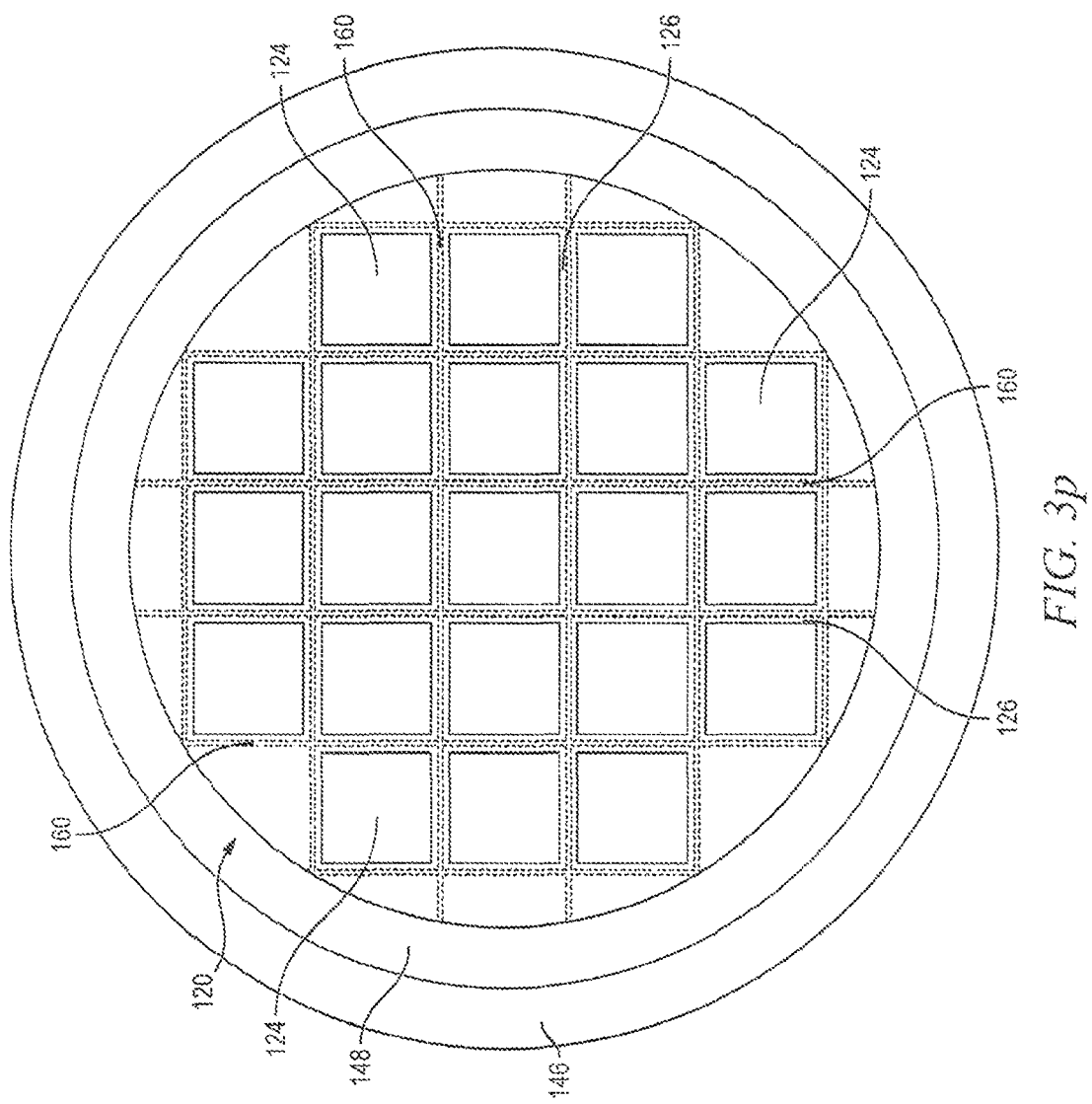
Figure 3Q:
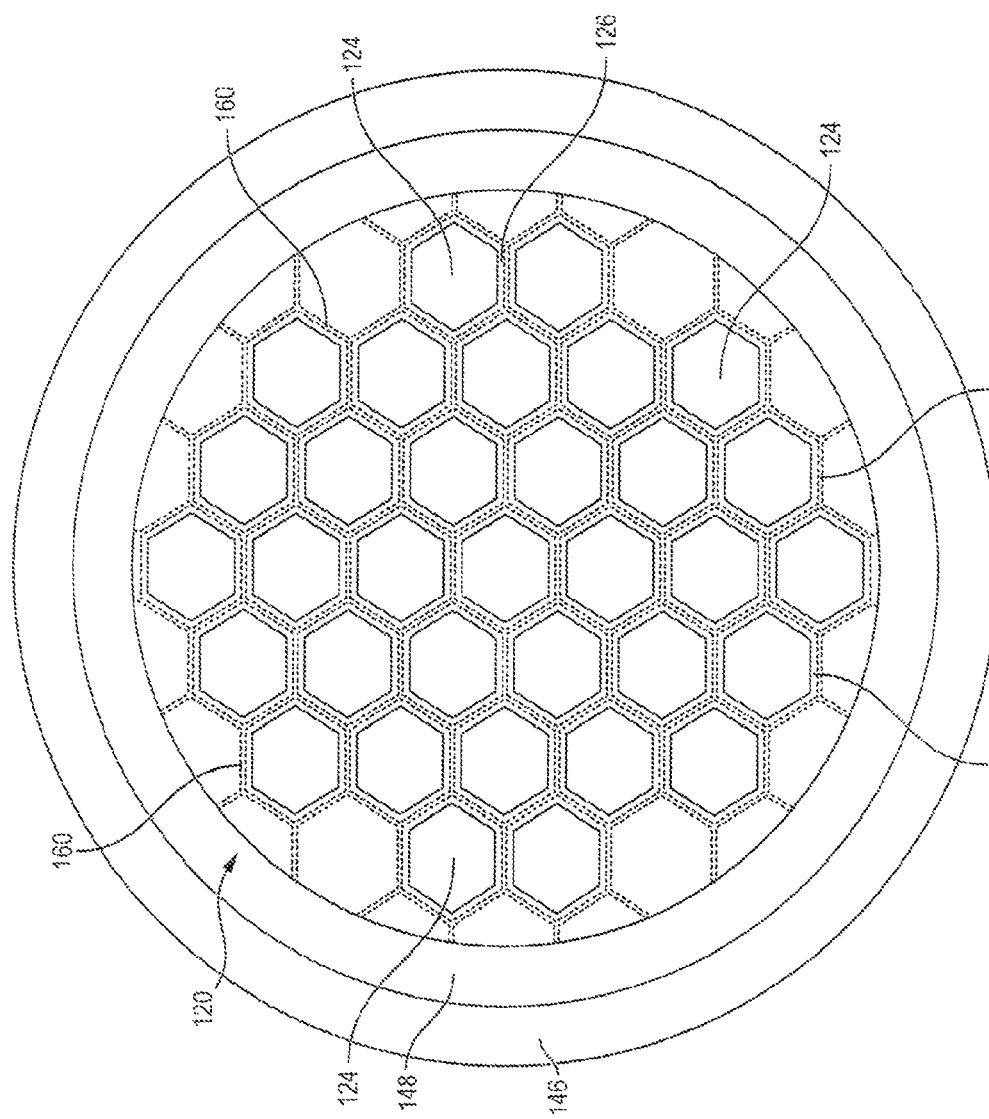
Figure 3R:
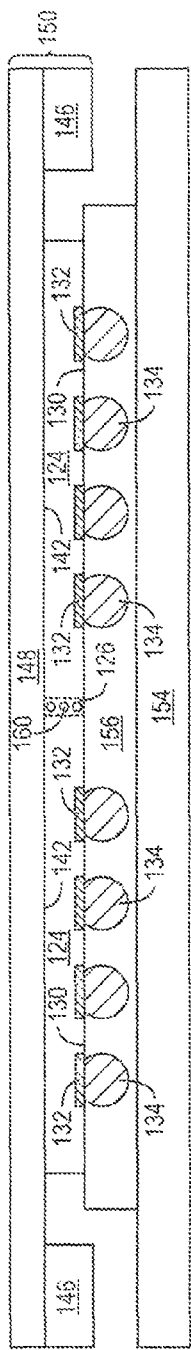
Figure 3S:
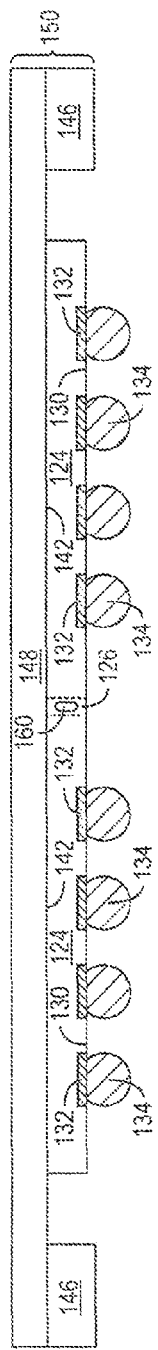
Figure 3T:
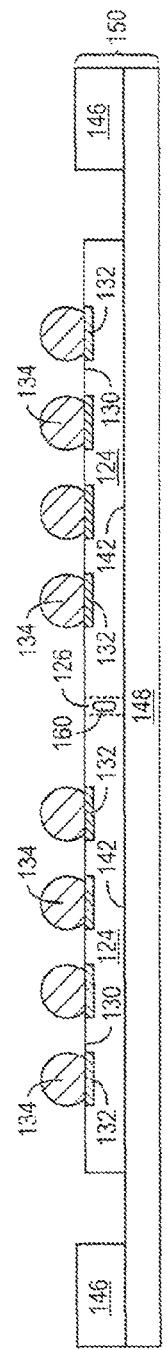
Figure 3W:
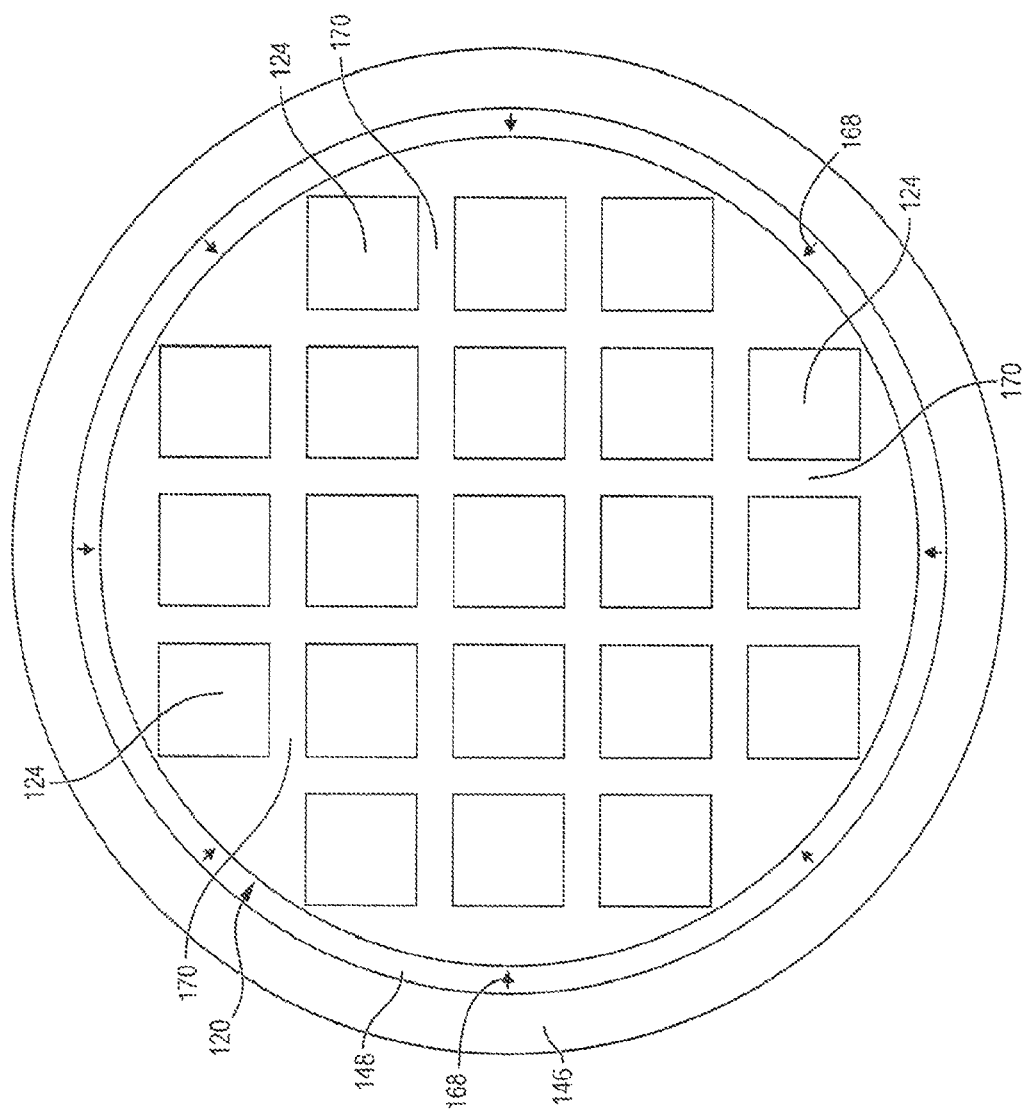
Figure 3X:
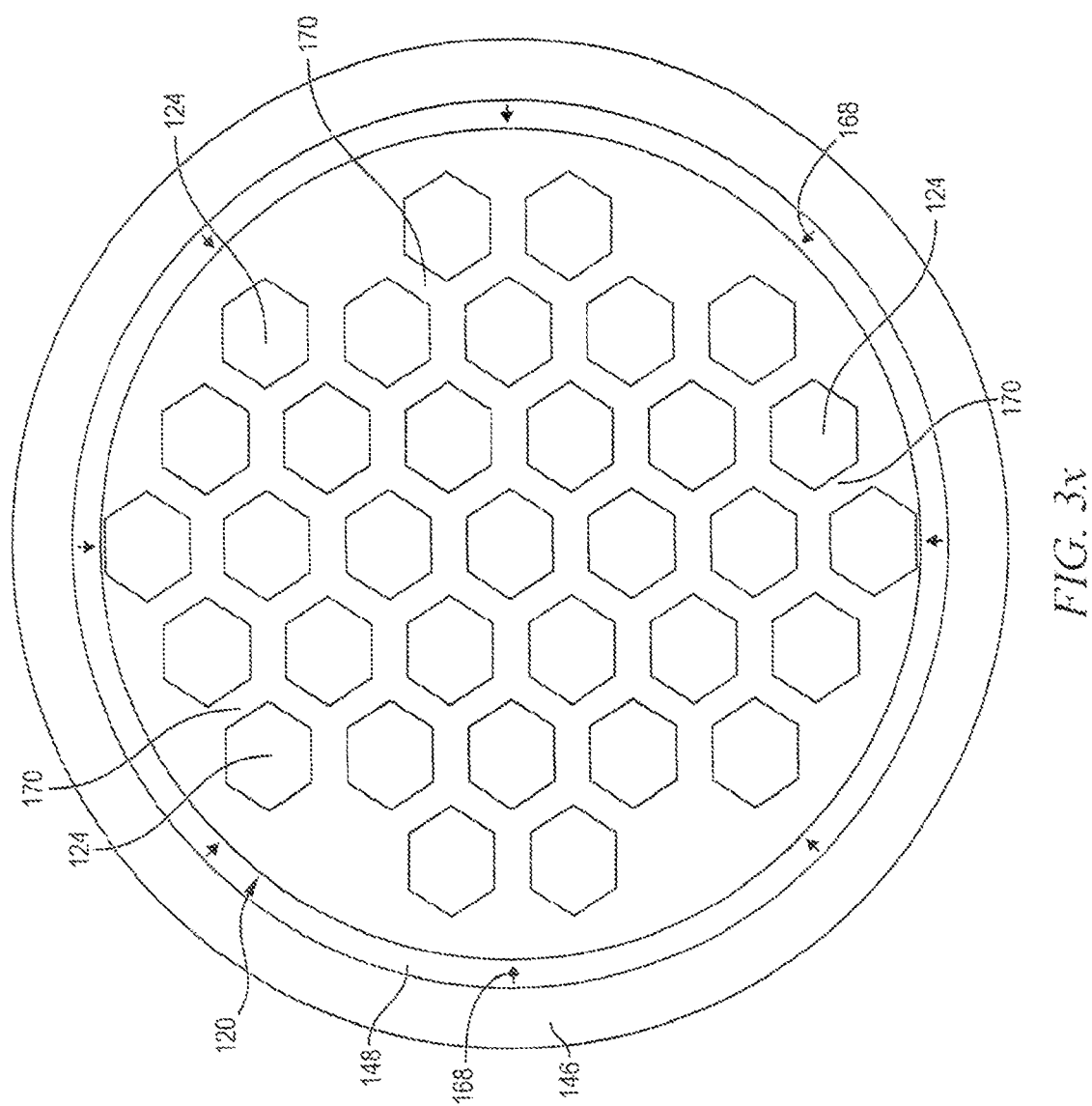

FIGS. 3a-3x illustrate, in relation to FIGS. 1 and 2a-2c, a process of singulating a semiconductor wafer by stealth dicing through a mounting tape. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or region 126 as described above. Non-active region 126 provides an area to singulate semiconductor wafer 120 into individual semiconductor die 124. Semiconductor die 124 can also be shaped as triangles, rectangles, parallelograms, hexagons, or general polygons with 3 or more sides. For example, FIG. 3b shows semiconductor wafer 120 with a plurality of hexagonal semiconductor die 124 separated by non-active region 126. FIG. 3c shows semiconductor wafer 120 with a plurality of triangular semiconductor die 124 separated by non-active region 126.

FIG. 3d shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3d. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

In FIG. 3e, an electrically conductive bump material is formed over conductive layer 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 132 using a suitable attachment or bonding process. In one embodiment, the bump material is reflowed by heating the material above its melting point to form balls or bumps 134. In some applications, bumps 134 are reflowed a second time to improve electrical contact to conductive layer 132.

Bumps 134 can also be compression bonded or thermocompression bonded to conductive layer 132. Compression bonding uses pressure in excess of 10 megapascals (MPa) (1450 psi) at temperatures below 200° C. to bond materials via solid-state diffusion. Typical materials bonded using compression bonding include indium (In), Au, Pb, and Pb/Sn alloys. Thermocompression bonding uses elevated temperatures in conjunction with pressure to bond materials. Typical materials bonded using thermocompression bonding include Cu, Au, and Al. In one embodiment, thermocompression bonding is used to bond Au bumps by applying 30 MPa of pressure at 300° C. for 2 minutes. Bumps 134 represent one type of interconnect structure that can be formed over conductive layer 132. The interconnect structure can also use stud bump, micro bump, conductive column, or other electrical interconnect.

In FIG. 3f, a backgrinding tape 136 is applied to active surface 130 and cover bumps 134 of semiconductor die 124. FIG. 3g shows a support table 138. Semiconductor wafer 120 is mounted to support table 138 with backgrinding tape 136 oriented to the table. A portion of back surface 128 is optionally removed by a combination of backgrinding with grinder 140, CMP, and/or etching processes to form a back surface 142 of semiconductor wafer 120 having reduced thickness. Alternatively, a portion of back surface 128 is removed by laser direct ablation (LDA) using laser 144 to form a back surface 142 of semiconductor wafer 120, as shown in FIG. 3h.

FIG. 3i shows semiconductor wafer 120 having reduced thickness after the backgrinding operation. Semiconductor wafer 120 is irradiated with ultra-violet (UV) light to prepare for removal of backgrinding tape 136 by weakening the adhesion between semiconductor die 124 and the backgrinding tape.

In FIG. 3j, wafer ring 146 is mounted to mounting tape 148, and the combined mounting assembly 150 (wafer ring 146 and mounting tape 148) is positioned over back surface 142 of semiconductor die 120. Wafer ring 146 is a rigid structure including metal, glass, ceramic, or composite material. Mounting tape 148 is a translucent or transparent material containing polyvinyl chloride, polypropylene, polyethylene, polyolefin, or similar materials. FIG. 3k shows mounting assembly 150 mounted to back surface 142 of semiconductor wafer 120 with the semiconductor wafer disposed within wafer ring 146.

In FIG. 3l, semiconductor wafer 120 and mounting assembly 150 are positioned and mounted to support table 152 with active surface 130 and bumps 134 oriented away from the support table. Backgrinding tape 136 is removed from semiconductor wafer 120.

FIG. 3m shows a support table 154. Semiconductor wafer 120 and mounting assembly 150 are positioned over support table 154 with active surface 130 and bumps 134 oriented toward the table. An intermediate penetrable adhesive sheet 156 is disposed between semiconductor wafer 120 and mounting assembly 150. The penetrable adhesive sheet 156 can be single or multi-layer polymer, such as b-staged curable epoxy resin. Semiconductor wafer 120 and mounting assembly 150 are mounted to support table 154 under pressure and elevated temperature. Bumps 134 are pressed into penetrable adhesive sheet 156 with force F. FIG. 3n shows semiconductor wafer 120 and mounting assembly 150 mounted to support table 154 with bumps 134 embedded within penetrable adhesive sheet 156. Alternatively, penetrable adhesive sheet 156 is secured to active surface 130 with bumps 134 embedded with the penetrable sheet prior to mounting to support table 154. Bumps 134 may contact support table 154 or remain completely embedded with penetrable adhesive sheet 156.

In FIG. 3o, laser 158 emits irradiated energy which passes through the translucent or transparent mounting tape 148 to form region 160. The light energy emitted by laser 158 passes through mounting tape 148 without substantially modifying the material characteristics of the mounting tape. In one embodiment, laser 158 has a wavelength of 1064 nanometers and produces light pulses of 1 microsecond or less duration, repeated at 10 microsecond intervals, with a peak power intensity of 100 megawatts/cm$^2$. The translucent or transparent mounting tape 148 passes 90% of the light energy to semiconductor wafer 120. The absorption of the laser light energy at the focal point of laser 158 modifies the material characteristics of base substrate material 122 in region 160. For example, if base substrate material 122 is primarily silicon, then the absorption of the laser light energy causes the silicon material to melt and re-solidify as polysilicon. The material within region 160 can also be vaporized, displaced, or changed in structure or composition by laser 158 to create a gap, crack, void in region 160. The modified region 160 can be contained within the interior of the unmodified non-active region 126, i.e., a portion of the unmodified non-active region remains around modified region 160. Alternatively, modified region 160 extends between an upper surface and lower surface of semiconductor wafer 120 with the unmodified non-active region 126 remaining on each side of modified region 160. Region 160 can occupy the entire area of non-active region 126. Region 160 can be vertical, diagonal, circular, oval, curved, or other shape. In other embodiments, region 160 can be formed using visible light, ultraviolet light, x-rays, microwaves, acoustic energy, ion beams, high energy particles, or other forms of radiated energy.

The modified region 160 is weaker than the unmodified material in non-active region 126 around region 160 and readily subject to breaking, fracture, or separation under mechanical pressure or stress, temperature change, acoustic energy, or chemical reaction. The weaker modified region 160 creates a separation point to singulate semiconductor wafer 120 along region 160 within non-active region 126 when subjected to tensile stress, mechanical pressure, or bending moment.

FIG. 3p shows a plan view of semiconductor wafer 120 containing modified region 160 within non-active region 126 around semiconductor die 124. The modified region 160 is formed by moving laser 158 over non-active region 126 or moving the non-active region under the laser while the laser is operating. FIG. 3q shows an embodiment of semiconductor wafer 120 containing hexagonal semiconductor die 124 and modified region 160 formed within non-active region 126.

FIG. 3r shows an embodiment with multiple modified regions 160 vertically aligned or stacked within non-active region 126, i.e., each modified region 160 is vertically aligned with other modified regions. Laser 158 passes over non-active region 126 a single time or multiple times to form multiple modified regions 160 at vertically offset locations within the non-active region. The focal point of laser 158 can be altered by vertically displacing the laser, altering the configuration of the optical path that the laser energy passes through, altering the optical properties of an element of the optical path that the laser energy passes through, or altering the wavelength of the laser.

In FIG. 3s, semiconductor wafer 120 and mounting assembly 150 are removed from support table 154 and penetrable adhesive sheet 156 by lifting, mechanical peeling, mechanical grinding, CMP, chemical etching, thermal bake, UV light, laser scanning, wet stripping, or other suitable process alone or in combination. In FIGS. 3t and 3u, semiconductor wafer 120 and mounting assembly 150 are positioned over and mounted to expansion table or jig 162 with mounting tape 148 oriented toward the expansion table or jig. Jig 162 includes a circular chuck or substrate or rigid ring with an outer diameter greater than or equal to the diameter of semiconductor wafer 120.

In FIG. 3v, semiconductor die 124 are singulated by moving jig 162 upward, as shown by arrows 164, while holding wafer ring 146 stationary. The movement of jig 162 relative to wafer ring 146 increases distance D and stretches or expands mounting tape 148, as shown by arrows 168. The stretching or expansion of mounting tape 148 creates stress in semiconductor wafer 120. The stress created in semiconductor wafer 120 by stretching or expanding mounting tape 148 causes region 160 to break, fracture, separate, or otherwise lose structural integrity. The separation or loss of structural integrity in region 160 singulates semiconductor wafer 120 into separate semiconductor die 124 with gap 170 between the semiconductor die.

In another embodiment, jig 162 is held stationary while wafer ring 146 moves downward to increase distance D and stretch or expand mounting tape 148. A downward-moving wafer ring 146 with an inner diameter greater than the diameter of jig 162 stretches or expands mounting tape 148 over the jig. The stretching or expansion of mounting tape 148 creates stress in semiconductor wafer 120. The stress created in semiconductor wafer 120 by stretching or expanding mounting tape 148 causes region 160 to break, fracture, separate, or otherwise lose structural integrity. The separation or loss of structural integrity in region 160 singulates semiconductor wafer 120 into separate semiconductor die 124 with gap 170 between the semiconductor die. Jig 162 can heat mounting tape 148 to improve the elasticity of the mounting tape.

FIG. 3w is a plan view of semiconductor wafer 120 singulated into individual semiconductor die 124 by stretching mounting tape 148. FIG. 3x is a plan view of an embodiment of semiconductor wafer 120 singulated into individual hexagonal semiconductor die 124 by stretching mounting tape 148.

FIG. 4 shows semiconductor die 124 after singulation. The circuits on active surface 130 of semiconductor die 124 are electrically connected through conductive layer 132 to bumps 134. A region 160 is formed in non-active region 126 of semiconductor wafer 120 by using laser 158 to irradiate energy through mounting tape 148 and modify the base substrate material to create a weak separation region for stealth-dicing of the semiconductor wafer. Irradiating light energy from laser 158 through mounting tape 148 improves control of the formation of region 160, increases product yield by preventing die shift and handling misses, reduces stray contaminants, and increases quality while maintaining high throughput.

The laser singulation process through mounting tape 148 increases the number of semiconductor die 124 per semiconductor wafer 120 by reducing the width of non-active region 126 and/or by using a more space efficient arrangement of the semiconductor die. The stealth-dicing process allows for narrower non-active region 126 for less wasted wafer area and more semiconductor die 124 per semiconductor wafer 120. The laser singulation process through mounting tape 148 reduces the number of defects that are introduced into the semiconductor wafer during manufacturing by containing contaminating material or debris produced during singulation. There is less need for post-singulation wafer cleaning. The laser singulation process through mounting tape 148 requires fewer processing steps and less handling of the semiconductor wafer which reduces the risk of breakage or other damage to semiconductor wafer 120. Penetrable adhesive sheet 156 protects bumps 134 from damage during the positioning of semiconductor wafer 120 and formation of region 160.

In addition, the stealth-dicing process allows for a wide variety of shapes for semiconductor die 124, resulting in more space efficient layout of the semiconductor die on semiconductor wafer 120. Some shapes of semiconductor die 124 made possible by the stealth-dicing process, such as a triangle, rectangle, parallelogram, hexagon, or general polygon with 3 or more sides, enable the production of larger-area semiconductor die by reducing the effect of focus and depth of focus limitations, off-axis illumination, and vignetting at the corners of the semiconductor die during manufacturing photolithography steps.

The laser singulation process through mounting tape 148 is applicable to larger semiconductor die. The larger semiconductor die can integrate more functionality onto the die to reduce cost, improve performance, and reduce power consumption, as compared to a multi-die implementation that provides the same functionality. The larger semiconductor die can be produced by reducing the effect of optical imperfections that occur at the periphery of the exposure area during the photolithographic processing commonly employed to manufacture semiconductor wafers. Typical optical imperfections that occur at the periphery of the exposure area during photolithographic processing include lack of focus, insufficient depth of focus, off-angle illumination, and reduced illumination intensity relative to the illumination intensity at the center of the exposed area.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer having a plurality of semiconductor die separated by a non-active region;
   forming a plurality of bumps over the semiconductor die;
   providing a mounting tape;
   disposing the semiconductor wafer over the mounting tape;
   disposing a penetrable layer over the bumps formed over the semiconductor wafer;
   applying irradiated energy to the non-active region through the mounting tape for form a modified region within the non-active region; and
   singulating the semiconductor wafer along the modified region to separate the semiconductor die.

2. The method of claim 1, further including:
   providing a wafer ring;
   mounting the wafer ring to the mounting tape; and
   mounting the semiconductor wafer to the mounting tape within the wafer ring.

3. The method of claim 1, further including:
   providing a laser; and
   applying the irradiated energy from the laser through the mounting tape to form the modified region within the non-active region.

4. The method of claim 1, wherein the mounting tape includes translucent or transparent material.

5. The method of claim 1, wherein the semiconductor die have a polygon shape with three or more sides.

6. The method of claim 1, further including removing a portion of semiconductor wafer to thin the semiconductor wafer.

7. A method of making a semiconductor device, comprising:
   providing a semiconductor wafer;
   providing a mounting tape;
   disposing the semiconductor wafer over the mounting tape;
   providing a laser;
   forming a modified region within a non-active region of the semiconductor wafer by applying irradiated energy from the laser through the mounting tape; and
   singulating the semiconductor wafer along the modified region.

8. The method of claim 7, further including:
   providing a wafer ring;
   mounting the wafer ring to the mounting tape; and
   mounting the semiconductor wafer to the mounting tape within the wafer ring.

9. The method of claim 7, further including applying a force to the mounting tape to expand the mounting tape and exert stress along the modified region to singulate the semiconductor wafer.

10. The method of claim 7, wherein the mounting tape includes translucent or transparent material.

11. The method of claim 7, further including forming the modified region as a plurality of vertically stacked modified regions.

12. The method of claim 7, further including:
    forming a plurality of bumps over the semiconductor wafer; and
    applying a penetrable layer over the bumps formed over the semiconductor wafer.

13. The method of claim 12, further including:
    singulating the semiconductor wafer along the modified region to separate the semiconductor wafer into a plurality of semiconductor die; and
    forming an encapsulant over the semiconductor die and bumps.

14. A method of making a semiconductor device, comprising:
    providing a semiconductor wafer;
    providing a mounting tape;
    disposing the semiconductor wafer over the mounting tape;

applying energy to a non-active region of the semiconductor wafer through the mounting tape to form a modified region within the non-active region; and singulating the semiconductor wafer along the modified region.

15. The method of claim 14, further including:

providing a wafer ring;

mounting the wafer ring to the mounting tape; and mounting the semiconductor wafer to the mounting tape within the wafer ring.

16. The method of claim 14, further including:

providing a laser; and applying irradiated energy from the laser through the mounting tape to form the modified region within the non-active region.

17. The method of claim 14, wherein the mounting tape includes translucent or transparent material.

18. The method of claim 14, further including applying a force to the mounting tape to expand the mounting tape and exert stress along the modified region to singulate the semiconductor wafer.

19. The method of claim 14, further including:

forming a plurality of bumps over the semiconductor wafer; and applying a penetrable layer over the bumps formed over the semiconductor wafer.

20. The method of claim 19, further including:

singulating the semiconductor wafer along the modified region to separate the semiconductor wafer into a plurality of semiconductor die; and forming an encapsulant over the semiconductor die and bumps.

21. A method of making a semiconductor device, comprising:

forming a modified region of a semiconductor wafer by application of energy through a mounting tape disposed over the semiconductor wafer; and singulating the semiconductor wafer along the modified region.

22. The method of claim 21, wherein singulating the semiconductor wafer further includes applying a force to the mounting tape to expand the mounting tape and exert stress along the modified region.

23. The method of claim 21, further including:

forming a bump over the semiconductor wafer; and applying a penetrable layer over the bump.

24. The method of claim 21, further including forming the modified region as a plurality of vertically stacked modified regions.

* * * * *